(12) United States Patent
Bellman et al.

(10) Patent No.: US 11,257,728 B2
(45) Date of Patent: Feb. 22, 2022

(54) FLUIDIC ASSEMBLY SUBSTRATES AND METHODS FOR MAKING SUCH

(71) Applicant: CORNING INCORPORATED, Corning, NY (US)

(72) Inventors: Robert Alan Bellman, Ithaca, NY (US); Rajesh Vaddi, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/618,602

(22) PCT Filed: May 31, 2018

(86) PCT No.: PCT/US2018/035495
§ 371 (c)(1),
(2) Date: Dec. 2, 2019

(87) PCT Pub. No.: WO2018/222938
PCT Pub. Date: Dec. 6, 2018

(65) Prior Publication Data
US 2020/0194323 A1      Jun. 18, 2020

Related U.S. Application Data

(60) Provisional application No. 62/514,196, filed on Jun. 2, 2017.

(51) Int. Cl.
*H01L 23/13*       (2006.01)
*H01L 21/48*       (2006.01)
(Continued)

(52) U.S. Cl.
CPC .............. *H01L 23/13* (2013.01); *C03C 15/00* (2013.01); *C03C 17/02* (2013.01);
(Continued)

(58) Field of Classification Search
CPC ..... H01L 23/13; H01L 21/4803; H01L 23/15; H01L 23/49822; H01L 33/483; H01L 25/0753; H01L 2224/95122; H01L 2224/95101; H01L 2924/1203; H01L 2224/95085; H01L 2224/95136; H01L 2924/12041; H01L 33/0095; H01L 24/95; C03C 15/00; C03C 17/02; C03C 2218/33
See application file for complete search history.

(56) References Cited

U.S. PATENT DOCUMENTS 6,527,964 B1 * 3/2003 Smith .................... B82Y 30/00
                                                                    216/19
7,727,788 B2    6/2010 Han et al.
(Continued)

OTHER PUBLICATIONS

Ulizio, M., "Optical Properties of Glass: How Light and Glass Interact" Aug. 24, 2015, KOPP Glass, www.koppglass.com/blog/optical-properties-glass-how-light-and-glass-interact. (Year: 2015).*
(Continued)

*Primary Examiner* — Anita K Alanko
(74) *Attorney, Agent, or Firm* — Ryan T. Hardee

(57) ABSTRACT

Embodiments are related to substrates having one or more well structures each exhibiting substantially vertical sidewalls and substantially planar bottoms.

15 Claims, 5 Drawing Sheets

(51) Int. Cl.
*H01L 23/15* (2006.01)
*H01L 23/498* (2006.01)
*H01L 33/48* (2010.01)
*C03C 15/00* (2006.01)
*C03C 17/02* (2006.01)
*H01L 25/075* (2006.01)

(52) U.S. Cl.
CPC .......... *H01L 21/4803* (2013.01); *H01L 23/15* (2013.01); *H01L 23/49822* (2013.01); *H01L 33/483* (2013.01); *C03C 2218/33* (2013.01); *H01L 25/0753* (2013.01)

(56) References Cited

U.S. PATENT DOCUMENTS

| | | | | |
|---|---|---|---|---|
| 9,892,944 | B2* | 2/2018 | Schuele | H01L 29/0657 |
| 9,917,226 | B1* | 3/2018 | Heine | H01L 33/32 |
| 2004/0056268 | A1 | 3/2004 | Onozawa et al. | |
| 2005/0103745 | A1* | 5/2005 | Li | G02B 3/04 216/26 |
| 2008/0190886 | A1 | 8/2008 | Choi et al. | |
| 2009/0242893 | A1* | 10/2009 | Tomiyasu | G02F 1/13454 257/72 |
| 2015/0069583 | A1* | 3/2015 | Kadowaki | H01L 29/452 257/627 |
| 2015/0351253 | A1 | 12/2015 | Witvrouw | |
| 2016/0380158 | A1* | 12/2016 | Sasaki | H01L 33/20 257/89 |

OTHER PUBLICATIONS

International Search Report and Written Opinion of the International Searching Authority; PCT/US2018/035495; dated Sep. 21, 2018; 17 Pages; Korean Intellectual Property Office.

* cited by examiner

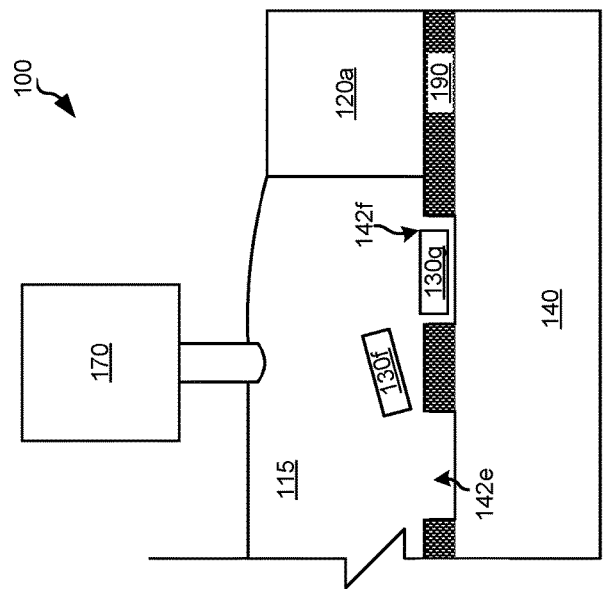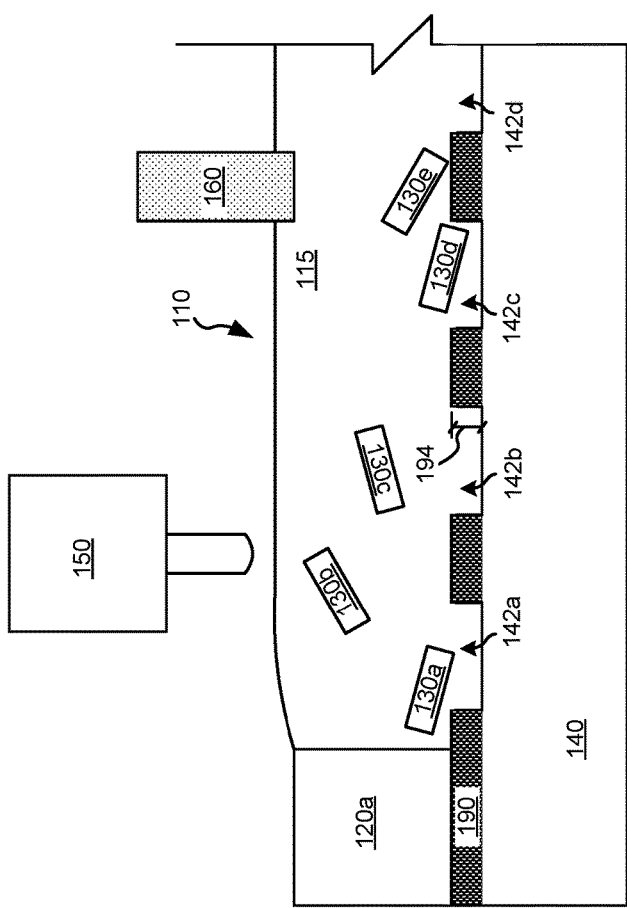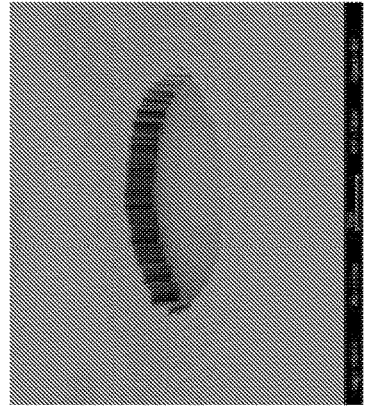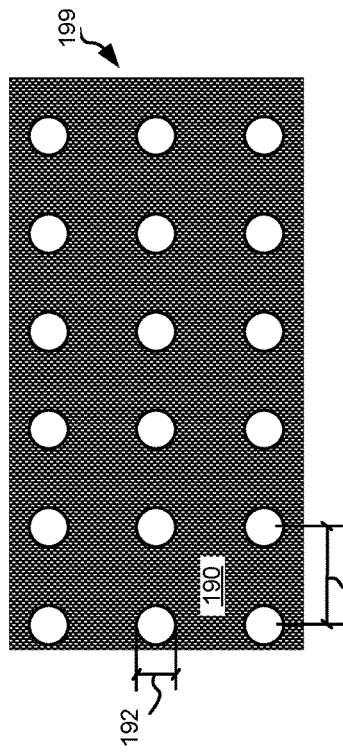
Fig. 1a
Fig. 1b
Fig. 1c

FLUIDIC ASSEMBLY SUBSTRATES AND METHODS FOR MAKING SUCH

CROSS-REFERENCE TO RELATED APPLICATIONS

This application claims the benefit of priority under 35 U.S.C. § 371 of International Application No. PCT/US2018/035495, filed on May 31, 2018, which claims the benefit of priority of U.S. Provisional Application Ser. No. 62/514,196 filed on Jun. 2, 2017, the contents of each of which are relied upon and incorporated herein by reference in their entirety as if fully set forth below.

FIELD OF THE INVENTION

Embodiments are related to substrates having one or more well structures each exhibiting substantially vertical sidewalls and substantially planar bottoms.

BACKGROUND

LED displays, LED display components, and arrayed LED devices include a large number of diodes placed at defined locations across the surface of the display or device. Fluidic assembly may be used for assembling diodes in relation to a substrate. Such assembly is often a stochastic process whereby LED devices are deposited into wells on a substrate. Forming such wells into the surface of a substrate using traditional approaches typically relies on forming the wells in a polymer film deposited on a glass substrate. Such polymer films exhibit poor transparency and thermal stability. The poor transparency can lead to a yellow or grey hue emanating from a display. The limited thermal stability limits process compatibility with subsequent electrical contact formation and passivation.

Hence, for at least the aforementioned reasons, there exists a need in the art for advanced systems and methods for manufacturing physical structures on a substrate.

SUMMARY

Embodiments are related to substrates having one or more well structures each exhibiting substantially vertical sidewalls and substantially planar bottoms.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 1a-1b depicts a fluidic assembly system capable of moving a suspension composed of a carrier liquid and a plurality of physical objects relative to a fluidic assembly substrate including a number of wells in accordance with one or more embodiments of the present inventions;

FIG. 1c is an image from a scanning electron microscope showing an uneven outer edge of a well sidewall due in part to the granularity of a material selected for a hard mask in accordance with some embodiments of the present inventions;

DETAILED DESCRIPTION OF SOME EMBODIMENTS

Figure 2A:
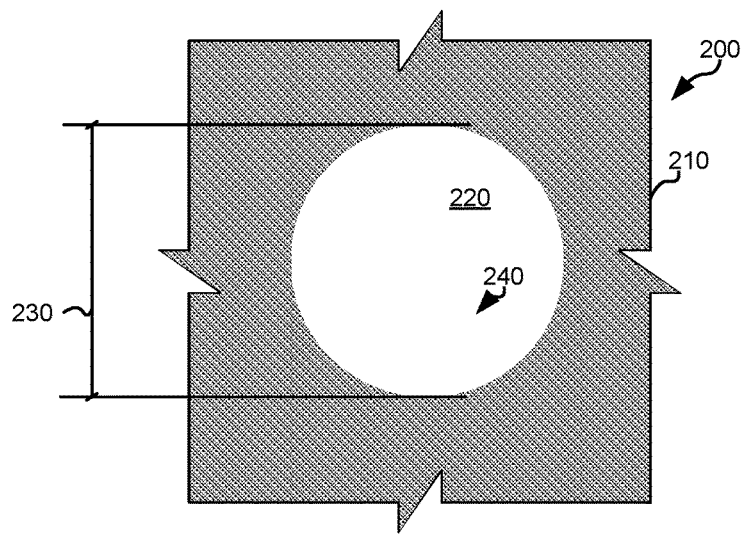
FIGS. 2a-2b depict a well structure in accordance with some embodiments of the present inventions.

Embodiments are related to substrates having one or more well structures each exhibiting substantially vertical sidewalls and substantially planar bottoms.

Various embodiments of the present inventions are fluidic assembly substrates. Such fluidic assembly substrates include: a transparent substrate, and an inorganic fluidic structure layer. The inorganic fluidic structure layer is disposed over the transparent substrate and is formed of an inorganic material. The inorganic fluidic structure layer includes a plurality of structures each exposing a portion of a top surface of the transparent substrate.

In some instances of the aforementioned embodiments, the transparent substrate is made of glass, and the inorganic material is silica. In various instances of the aforementioned embodiments, the plurality of structures are wells. In some such instances, a sidewall of each of the wells is substantially vertical relative to the top surface of the transparent substrate. In particular cases, the sidewall of each of the wells exhibits an angle of greater than ninety-one degrees and less than one-hundred, five degrees measured from the top surface of the transparent substrate. In other particular cases, the sidewall of each of the wells exhibits an angle of greater than eighty degrees and less than ninety degrees measured from the top surface of the transparent substrate.

In one or more instances of the aforementioned embodiments, the top surface of the transparent substrate exposed by each of the plurality of structures is substantially planar. In various instances of the aforementioned embodiments, an electrical connectivity layer is disposed between the transparent substrate and the inorganic fluidic structure layer with a portion of the electrical connectivity layer being exposed at the bottom of at least one of the plurality of structures. In some instances of the aforementioned embodiments where the plurality of structures are wells, each of the wells exhibits a depth of greater than three microns and a width of greater than forty microns. In some instances of the aforementioned embodiments, a combination of the transparent substrate and the inorganic material is mechanically stable at temperatures up to six hundred degrees Celsius.

Other embodiments of the present inventions provide a method for manufacturing a fluidic assembly substrate. Such methods include: providing a transparent substrate; depositing an inorganic material over the transparent substrate to form an inorganic material layer; forming a patterned hard mask atop the inorganic material layer with openings exposing portions of the inorganic material layer corresponding to structure locations; and performing a dry etch guided by the patterned hard mask to open structures in the inorganic material layer extending to a top surface of the transparent substrate.

In some instances of the aforementioned embodiments, the transparent substrate is made of glass, and the inorganic material is silica. In various instances of the aforementioned embodiments, depositing the inorganic material over the transparent substrate includes performing plasma enhanced chemical vapor deposition of $SiO_2$ over the transparent substrate. Such deposition of $SiO_2$ may utilize Tetra-ethyl-ortho silicate as a precursor. Other precursors including, but not limited to, Silane, DABS, $SiCl_4$ may be used in relation to different embodiments. As an alternative material for the inorganic material layer an oxide glass film in the composition space $SiO_2$—$GeO_2$—$B_2O_3$—$P2O_5$. As yet another alternative material for the inorganic material layer Flourine or Nitrogen anions may be added to the deposited film to yield, for example, $SiO_2$, SiON, PSG ($SiO_2$—$P_2O_5$), or BPSG ($SiO_2$—$B_2O_3$—$P_2O_5$). In one or more instances of the aforementioned embodiments, forming the patterned hard mask atop the inorganic material layer with openings exposing portions of the inorganic material layer corresponding to structure locations includes: depositing nickel on top of the inorganic material layer; performing photolithography to define the openings; and performing a wet etch to expose portions of a top surface of the inorganic material layer corresponding to the openings.

In various instances of the aforementioned embodiments, the dry etch is selected from a group consisting of: a reactive ion etch (RIE), and an inductive coupled plasma and reactive ion etching (ICP-RIE). In one or more instances of the aforementioned embodiments, the structures in the inorganic material layer are wells, and a sidewall of each of the wells is substantially vertical relative to the top surface of the transparent substrate.

In one or more instances of the aforementioned embodiments, the top surface of the transparent substrate exposed by each of the structures in the inorganic material layer is substantially planar. In some instances of the aforementioned embodiments, the methods further include: forming an electrical connectivity layer on top of the transparent substrate prior to depositing the inorganic material over the transparent substrate to form the inorganic material layer over both the transparent substrate and the electrical connectivity layer. In some such instances, a portion of the electrical connectivity layer is exposed by the dry etch at the bottom of at least one of the structures in the inorganic material layer.

In some instances of the aforementioned embodiments, the structures in the inorganic material layer are wells each having a depth of greater than three microns and a width of greater than forty microns. In one or more instances of the aforementioned embodiments, a combination of the transparent substrate and the inorganic material layer is mechanically stable at temperatures up to six hundred degrees Celsius.

Various embodiments of the present inventions are directed at large area glass well plates and methods for manufacturing such. Such methods result in an array of precisely patterned wells with flat bottoms suitable for fabrication of large area displays by fluid self-assembly of micro-devices. The well plate is comprised of a glass substrate and inorganic layers in which a plurality of wells are formed by a subtractive patterning process. A flat well is realized because the inorganic layers are chosen to etch faster than the glass substrate. Well depth and sidewall angle may be adjusted in fabrication as needed to aid fabrication and making electrical contacts. Where the devices to be self assembled are micro light emitting diodes, the well plate may be designed to accommodate one or both of top and bottom electrical contacts. Driving the micro light emitting diodes may be done by either a passive matrix or an active matrix. Bottom electrical contacts may be formed prior to well formation or after well formation. In particular cases, the micro light emitting diodes are cylindrical with diameters in the tens of microns and height greater than one (1) and less than ten (10) microns. As a specific example, the micro light emitting diodes may exhibit a diameter of about fifty (50) microns and a height of about five (5) microns.

Turning to FIG. 1*a*, a fluidic assembly system 100 is shown that is capable of moving a suspension 110 composed of a carrier liquid 115 and a plurality of physical objects 130 relative to an inorganic fluidic structure layer 190 atop a surface of a substrate 140 in accordance with one or more embodiments of the present inventions. Although the example discussed in relation to FIGS. 1*a*-1*b* focuses on fluidically deposited physical objects, the substrate which includes a fluidic structure layer may be used in relation to other assembly methods such as, for example, pick-n-place or other variations. Physical objects 130 can include electronic elements, diodes, microLEDs, and other objects. In some cases, a material is deposited on top of substrate 140 to form an un-patterned predecessor of fluidic structure layer 190. A hard mask is then formed over the un-patterned material exposing areas corresponding to wells 142. A dry etch is then performed to etch wells 142 into the un-patterned material down to a top surface of substrate 140. The hard mask is then removed leaving fluidic structure layer 190. The coating, deposition or other build-up of the combination of substrate 140 and inorganic fluidic structure layer 190 may be done either before or after forming electronic circuitry on one or more of substrate 140 and fluidic structure layer 190. In some cases, the combination of substrate 140 and inorganic fluidic structure layer 190 may be rigid, and in other cases the combination may be flexible. As one example, such an approach allows for fabricating large area fluidic assembly plates that can accommodate a large number of micro light emitting diode devices each deposited into a respective one of wells 142 to form a display panel. Other examples where such an approach may be useful include, but are not limited to, large area lighting and signage, and radio frequency identification tags.

In some embodiments the material used to form substrate 140 is glass, and the material used to form inorganic fluidic structure layer 190 is an inorganic material. The combination of the glass and the inorganic material are selected such that the susceptibility (i.e., one material etches at a different rate than the other) to the dry etch performed to open wells 142 is much greater in the inorganic material than in the glass allowing for use of the top surface of substrate 140 as a stop for the dry etch process. Such difference in etch susceptibility and use of substrate 140 as an etch stop results in wells 142 having substantially flat bottoms defined by the upper surface of substrate 140. In addition, the use of a dry etch process guided by the aforementioned hard mask results in sidewalls of the wells 142 that are substantially vertical. The glass of substrate 140 and the inorganic material of inorganic fluidic structure layer 190 are further chosen to be mechanically compatible when exposed to processing temperatures of greater than six hundred degrees Celcius (600 C). Such processing temperatures accommodate, inter alia, thin film transistor fabrication, solder reflow, and eutectic bonding processes.

In some cases, physical objects 130 may be micro-diodes, however, in other cases the physical objects may be other electronic devices or non-electronic devices. Turning to FIG. 1b, an example top view 199 of the surface of substrate 140 is shown with an array of wells (shown as circles) extending into fluidic structure layer 190. Each of wells 142 has a diameter 192 and a depth 194. It should be noted that while wells 142 are shown as circular in cross-section, other shapes may be used in relation to different embodiments. For example, other shapes, such as, for example, square, trapezoid, or other arbitrary shapes may be supported using different embodiments of the present inventions. Further, while wells 142 are generally shown as having a smooth, circular outer edge, the outer edge may exhibit some roughness due in part to the granularity of the material used for the hard mask similar to that shown in FIG. 1c. In one particular embodiment, the hard mask is made of nickel (Ni).

In some embodiments, substrate 140 is a glass substrate and diameter 192 is forty (40) micrometers or more formed in inorganic fluidic structure layer 190 at five hundred (500) micrometers offsets 193 or less. Depth 194 is greater than three (3) micrometers. It should be noted that while in some embodiments the bottom of wells are formed of a portion of a top surface of substrate 140 where through holes are formed in fluidic structure layer 190, in other embodiments substrate 140 and inorganic fluidic structure layer 190 are a single layer of the same material into which wells 142 are defined that extend only part way through the single layer.

In some cases, the thickness of inorganic fluidic structure layer 190 is substantially equal to the height of physical objects 130 where the aforementioned etching is used to form a through hole extending to a top surface of substrate 140. In other cases, the thickness of inorganic fluidic structure layer 190 is greater than the thickness of physical objects 130 where wells 142 are to be formed entirely within fluidic structure layer 190. In other cases, the thickness of the fluidic structure layer 190 is less than the thickness of physical objects. Note that a variety of physical objects that vary in size, shape, thickness, and composition can be assembled onto a substrate that includes a fluidic structure layer. An inlet opening of wells 142 is greater that the width of physical objects 130 such that only one physical object 130 deposits into any given well 142. It should be noted that while embodiments discuss depositing physical objects 130 into wells 142, that other devices or objects may be deposited in accordance with different embodiments of the present inventions.

A depositing device 150 deposits suspension 110 over the surface of substrate 140 with suspension 110 held on top of substrate 140 by sides 120 of a dam structure. In some embodiments, depositing device 150 is a pump with access to a reservoir of suspension 110. A suspension movement device 160 agitates suspension 110 deposited on substrate 140 such that physical objects 130 move relative to the surface of substrate 140. As physical objects 130 move relative to the surface of substrate 140 they deposit into wells 142. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump.

A capture device 170 includes an inlet extending into suspension 110 and capable of recovering a portion of suspension 110 including a portion of carrier liquid 115 and non-deposited physical objects 130, and returning the recovered material for reuse. In some embodiments, capture device 170 is a pump. In some cases, the combination of substrate 140 and inorganic fluidic structure layer 190 is formed using one or more of the processes discussed below in relation to FIGS. 2-5.

The combination of substrate 140 and inorganic fluidic structure layer 190 may exhibit not only physical features such as wells 142 shown in fluidic assembly system 100, fluidic channels, or other physical surface structures, but also mechanical characteristics like the rigidity or flexibility discussed above, but also can be chosen or formed to exhibit specific optical properties. For example, in terms of optical properties, the combination of substrate 140 and inorganic fluidic structure layer 190 can remain substantially transparent, have regions of being opaque to block or isolate light, have regions of a specific optical absorption, or have regions of controlled optical scattering. Patterning of the combination of substrate 140 and inorganic fluidic structure layer 190 may occur on only a top surface as shown in fluidic assembly system 100, or on both a top and bottom surface. Two-dimensional shape of the physical features can be controlled using a proper photomask, and the vertical sidewall angle of the physical structures while shown in FIG. 1 as being purely vertical can be angled or otherwise shaped.

Figure 2B:
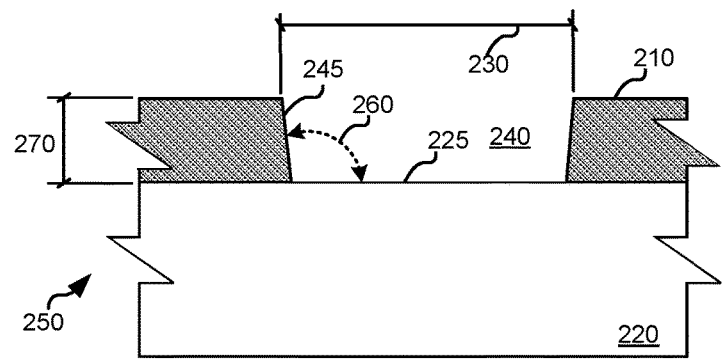

Turning to FIGS. 2a-2b, a top view 200 and a corresponding side view 250 of a portion of a fluidic assembly substrate including a well structure 240 is shown in accordance with some embodiments of the present inventions. As shown, well structure 240 extends into an inorganic structure layer 210 to a top surface 225 of a substrate 220. Well structure 240 exhibits a width 230 and a depth 270. A sidewall 245 of well structure 240 exhibits a sidewall angle 260 measured from top surface 225. Sidewall 245 extends substantially vertical from top surface 225. As used herein, the phrase "substantially vertical" is used in its broadest sense to mean any value of sidewall angle 260 that is between eighty (80) degrees and one hundred (110) degrees. Further, top surface 225 is substantially planar. As used herein, the phrase "substantially planar" is used in its broadest sense to mean any surface having a TIR (Total Indicator Reading or Total Indicator Runout) of less than 200 µm.

In some embodiments the material used to form substrate 220 is glass, and the material used to form inorganic structure layer 210 is an inorganic material. The combination of the glass and the inorganic material are selected such that the susceptibility (i.e., one material etches at a different rate than the other) to the dry etch performed to open well 240 is much greater in the inorganic material than in the glass allowing for use of the top surface 225 of substrate 220 as a stop for the dry etch process. Such difference in etch susceptibility and use of substrate 220 as an etch stop results in well 240 having a substantially flat bottom defined by top surface 225 of substrate 220. As more fully discussed below in relation to FIG. 3, a dry etch process guided by a hard mask disposed over inorganic structure layer 210 results in sidewall 245 of well 240 having a substantially vertical angle from top surface 225. The glass of substrate 220 and the inorganic material of inorganic structure layer 210 are further chosen to be mechanically compatible when exposed to processing temperatures of greater than six hundred degrees Celsius (600 C). Such processing temperatures accommodate, inter alia, thin film transistor fabrication, solder reflow, and eutectic bonding processes. In one particular embodiment, the inorganic material is silica.

Figure 2C:
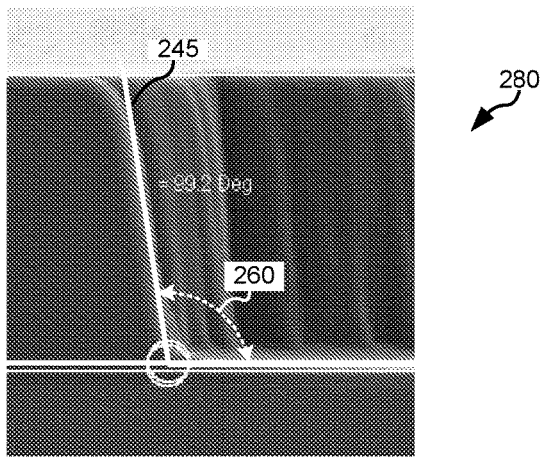
FIG. 2c is an image from a scanning electron microscope showing a substantially vertical sidewall of a well achievable in accordance with some embodiments of the present inventions.

Turning to FIG. 2c, an image 280 from a scanning electron microscope showing a substantially vertical sidewall 245 of a well 240 achievable in accordance with some embodiments of the present inventions. As shown, angle 260 of sidewall 245 is ninety-nine and two tenths degrees measured from top surface 225 of well 240. It should be noted that this verticality of sidewall 245 is one example of many achievable using the technology disclosed herein.

Figure 3:
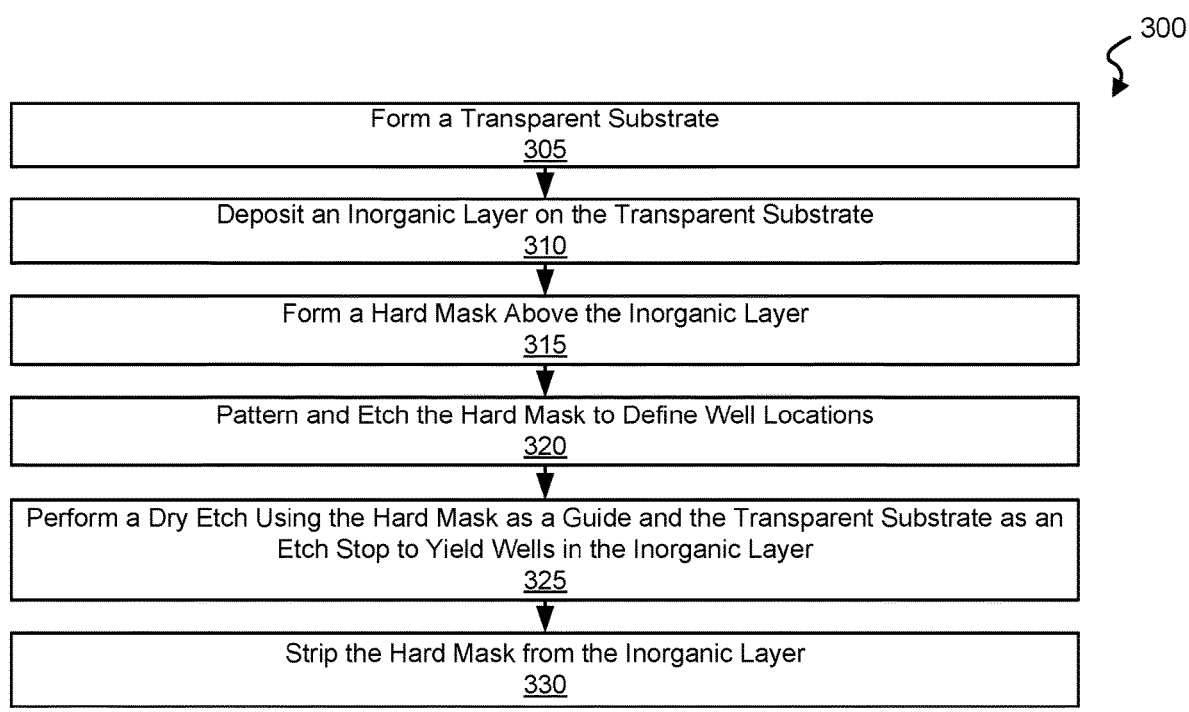
FIG. 3 is a flow diagram depicting a method in accordance with various embodiments of the present inventions for forming well structures in a fluidic assembly substrate.

Turning to FIG. 3, a flow diagram 300 depicts a method in accordance with various embodiments of the present inventions for forming well structures in a fluidic assembly substrate. Following flow diagram 300, a transparent substrate is formed (block 305). The transparent substrate may be, but is not limited to, a Corning Eagle XG® slim glass substrate formed using processes known in the art. In particular instances, the Corning Eagle XG® slim glass substrate is seven hundred (700) microns thick. Based upon the disclosure provided herein, one of ordinary skill in the art will recognize other transparent substrates and thicknesses that may be used in relation to different embodiments of the present inventions.

An inorganic material is then deposited on the transparent substrate to yield a inorganic layer over the transparent substrate (block 310). In some embodiments, the inorganic material is silica, and the inorganic layer is five (5) microns thick. In particular cases, the inorganic layer is formed by plasma enhanced chemical vapor deposition (PECVD) using the following processing conditions: 650 W, 13.56 MHz RF, 9 Torr pressure, 210 mils gap, 1250 sccm He through 38 C TEOS bubbler, 600 sccm $O_2$, and a 390 degree Celsius deposition temperature using an Applied Materials P5000. Based upon the disclosure provided herein, one of ordinary skill in the art will recognize other inorganic materials, thicknesses, and formation processes that may be used in relation to different embodiments of the present inventions.

A hard mask is formed above the inorganic layer (block 315). The hard mask includes openings exposing the inorganic layer at locations where wells are to be formed in the inorganic layer. In some embodiments, the hard mask is a two thousand (2000) Angstrom thick nickel (Ni) layer that is deposited over the inorganic layer using e-beam evaporation. Based upon the disclosure provided herein, one of ordinary skill in the art will recognize other hard mask materials, thicknesses, and formation processes that may be used in accordance with one or more embodiments of the present inventions.

The hard mask is patterned and etched to define well locations (block 320). In some cases, photolithography is used to define the location of openings in the hard mask. Once the photolithography is complete, the hard mask is exposed to a wet etch to open holes in the hard mask exposing the inorganic layer at locations where wells are to be formed in the inorganic layer. In one particular case where the hard mask is formed of nickel (Ni), the wet etch is performed by exposing the hard mask layer to a mixture of Nitric acid, Acetic acid, and Sulfuric acid. The aforementioned mixture yields an etch rate of five hundred (500) Angstrom per second at sixty (60) degrees Celsius.

A dry etch process is applied using the hard mask as a guide and the transparent substrate as an etch stop to yield wells in the inorganic layer (block 325). The transparent substrate acts as a good etch stop where it is substantially less susceptible to the dry etch process than the inorganic layer. As the transparent substrate is substantially less susceptible to the dry etch process than the inorganic layer, the depth of the wells that are formed is substantially equal to the thickness of the inorganic layer, and the bottoms of the wells are substantially planar. In some cases, the dry etch process is an anisotropic dry etch process, such as reactive ion etch (RIE) or inductive coupled plasma and reactive ion etching (ICP-RIE) removes the TEOS layer without substantial undercutting desirable for fluidic assembly of micro components. In some cases, dry etching wells in the inorganic layer is performed using C4F8 and O2 where the inorganic layer is TEOS. In such a case, the etch rate of TEOS and the etch selectivity of TEOS to Ni is approximately 3150 A/min and 35:1 respectively.

With the wells formed, the hard mask is stripped away from the inorganic layer (block 330). This stripping may be done using the same wet etch process used to define the openings in the hard mask layer. Based upon the disclosure provided herein, one of ordinary skill in the art will recognize a variety of stripping processes that may be used in relation to different embodiments of the present inventions. The resulting inorganic layer including the wells disposed over the transparent substrate forms a fluidic assembly substrate.

Figure 4A:
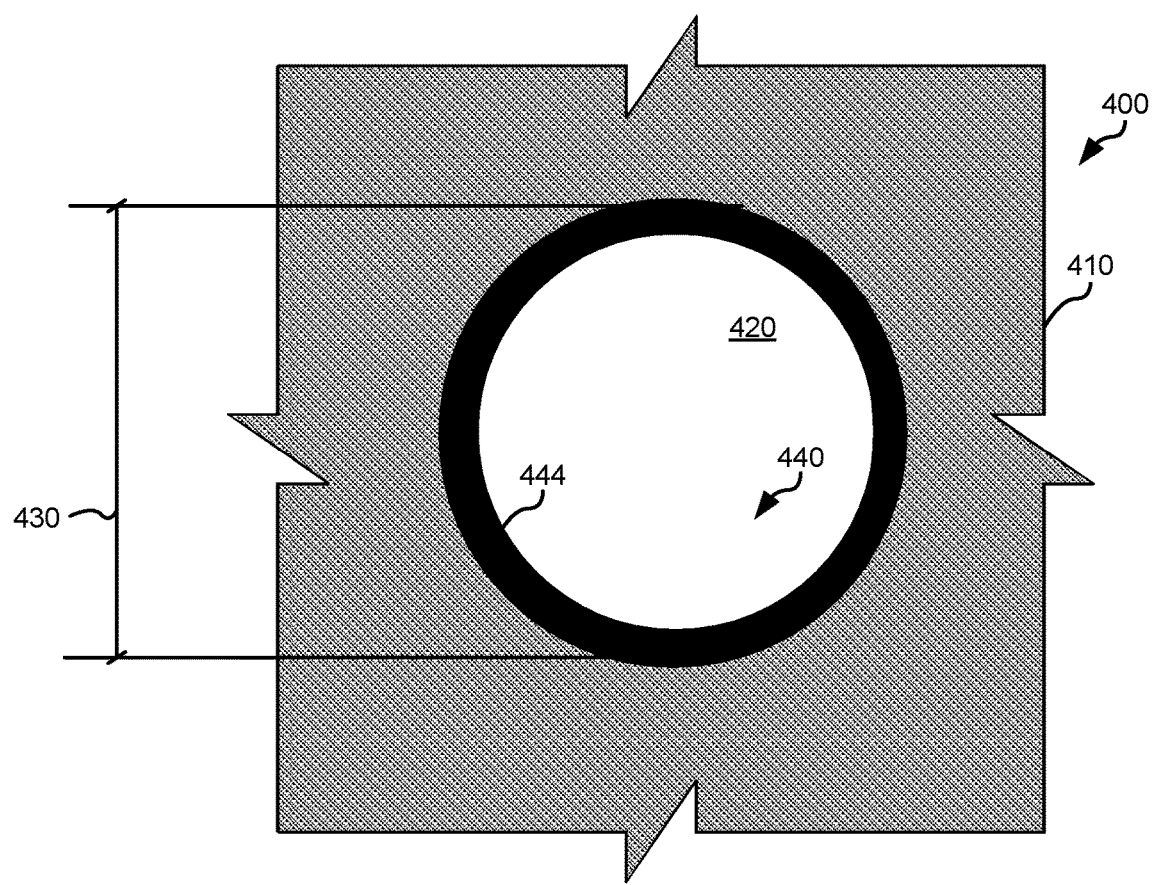
FIGS. 4a-4b depict a well structure in accordance with other embodiments of the present inventions.
Figure 4B:
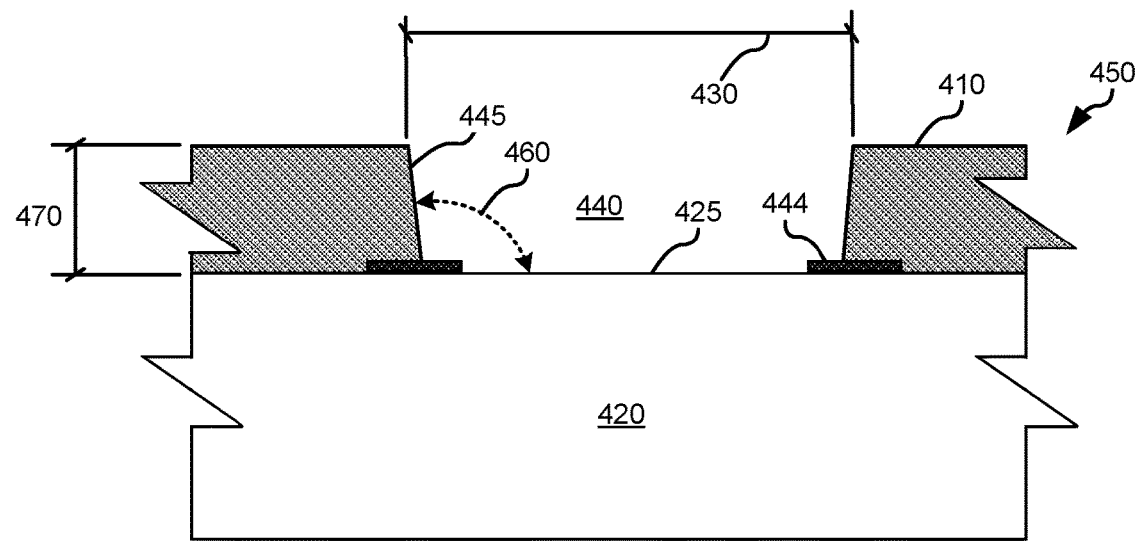

Turning to FIGS. 4a-4b, a top view 400 and a corresponding side view 450 of a portion of a fluidic assembly substrate including a well structure 440 is shown in accordance with some embodiments of the present inventions. As shown, well structure 440 extends into an inorganic structure layer 410 to a top surface 425 of a substrate 420. Well structure 440 exhibits a width 430 and a depth 470. A sidewall 445 of well structure 440 exhibits a sidewall angle 460 measured from top surface 425. Sidewall 445 extends substantially vertical from top surface 425. Further, top surface 425 is substantially planar. An electrical connection layer 444 is patterned on top surface 425 around the edge of well 440. As shown in FIG. 4b, electrical connection layer 444 extends partially under inorganic structure layer 410 with a portion exposed at the bottom of well 440.

In some embodiments the material used to form substrate 420 is glass, and the material used to form inorganic structure layer 410 is an inorganic material. The combination of the glass and the inorganic material are selected such that the susceptibility (i.e., one material etches at a different rate than the other) to the dry etch performed to open well 440 is much greater in the inorganic material than in the glass allowing for use of the top surface 425 of substrate 420 as a stop for the dry etch process. Such difference in etch susceptibility and use of substrate 420 as an etch stop results in well 440 having a substantially flat bottom defined by top surface 425 of substrate 420. As more fully discussed below in relation to FIG. 5, a dry etch process guided by a hard mask disposed over inorganic structure layer 410 results in sidewall angle 460 of sidewall 445 of well 440 having a substantially vertical angle from top surface 425. The glass of substrate 420 and the inorganic material of inorganic structure layer 410 are further chosen to be mechanically compatible when exposed to processing temperatures of greater than six hundred degrees Celsius (600 C). Such processing temperatures accommodate, inter alia, thin film transistor fabrication, solder reflow, and eutectic bonding processes. In one particular embodiment, the inorganic material is silica.

Figure 5:
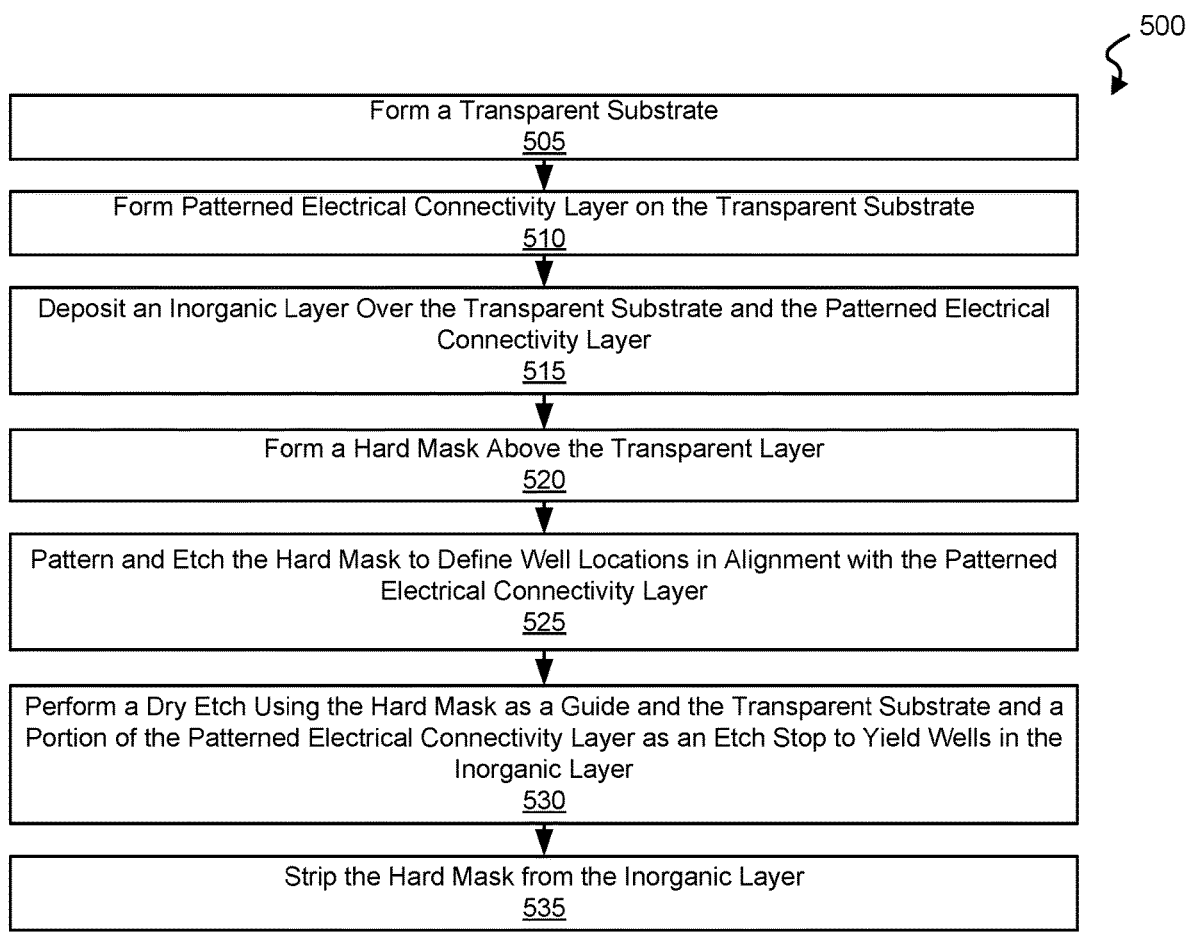
FIG. 5 is a flow diagram depicting a method in accordance with further embodiments of the present inventions for forming well structures in a fluidic assembly substrate.

Turning to FIG. 5, a flow diagram 500 depicts a method in accordance with various embodiments of the present inventions for forming well structures in a fluidic assembly substrate. Following flow diagram 500, a transparent substrate is formed (block 505). The transparent substrate may be, but is not limited to, a Corning Eagle XG® slim glass substrate formed using processes known in the art. In particular instances, the Corning Eagle XG® slim glass substrate is seven hundred (700) microns thick. Based upon the disclosure provided herein, one of ordinary skill in the art will recognize other transparent substrates and thicknesses that may be used in relation to different embodiments of the present inventions.

An electrical connectivity layer is formed on top of the transparent substrate (block 510). Formation of the electrical connectivity layer may be done using any process known in the art for forming electrical contacts. Once completed, the electrical contacts will provide connectivity in the bottom of wells formed above the transparent substrate. Based upon the disclosure provided herein, one of ordinary skill in the art will recognize a variety of processes and materials that can be used in relation to different embodiments of the present invention for forming an electrical connectivity layer.

An inorganic material is then deposited on the transparent substrate and the patterned electrical connectivity layer to yield a inorganic layer over the transparent substrate (block 515). In some embodiments, the inorganic material is silica, and the inorganic layer is five (5) microns thick. In particular cases, the inorganic layer is formed by PECVD deposition using Tetra-ethyl-ortho silicate (TEOS) on an Applied Materials P5000. Based upon the disclosure provided herein, one of ordinary skill in the art will recognize other inorganic materials, thicknesses, and formation processes that may be used in relation to different embodiments of the present inventions.

A hard mask is formed above the inorganic layer (block 520). The hard mask includes openings exposing the inorganic layer at locations where wells are to be formed in the inorganic layer. In some embodiments, the hard mask is a two thousand (2000) Angstrom thick nickel (Ni) layer that is deposited over the inorganic layer using e-beam evaporation. Based upon the disclosure provided herein, one of ordinary skill in the art will recognize other hard mask materials, thicknesses, and formation processes that may be used in accordance with one or more embodiments of the present inventions.

The hard mask is patterned and etched to define well locations (block 525). In some cases, photolithography is used to define the location of openings in the hard mask. Once the photolithography is complete, the hard mask is exposed to a wet etch to open holes in the hard mask exposing the inorganic layer at locations where wells are to be formed in the inorganic layer. In one particular case where the hard mask is formed of nickel (Ni), the wet etch is performed by exposing the hard mask layer to a mixture of Nitric acid, Acetic acid, and Sulfuric acid. The aforementioned mixture yields an etch rate of five hundred (500) Angstrom per second at sixty (60) degrees Celsius.

A dry etch process is applied using the hard mask as a guide and the transparent substrate as an etch stop to yield wells in the inorganic layer (block 530). The transparent substrate acts as a good etch stop where it is substantially less susceptible to the dry etch process than the inorganic layer. Similarly, the material used for the patterned electrical connectivity layer to be exposed at the bottom of the wells formed using the dry etch is chosen to be less susceptible to the dry etch than the material of the inorganic layer. As both the transparent substrate and the electrical connectivity layer are substantially less susceptible to the dry etch process than the inorganic layer, the depth of the wells that are formed is substantially equal to the thickness of the inorganic layer, and the bottoms of the wells are substantially planar with exception of the step up for the electrical connectivity layer formed on the surface of the transparent substrate. In some cases, the dry etch process is an anisotropic dry etch process, such as reactive ion etch (RIE) or inductive coupled plasma and reactive ion etching (ICP-RIE) removes the TEOS layer without substantial undercutting desirable for fluidic assembly of micro components. In some cases, dry etching wells in the inorganic layer is performed using C4F8 and O2 where the inorganic layer is TEOS. In such a case, the etch rate of TEOS and the etch selectivity of TEOS to Ni is approximately 5150 A/min and 55:1 respectively.

With the wells formed, the hard mask is stripped away from the inorganic layer (block 535). This stripping may be done using the same wet etch process used to define the openings in the hard mask layer. Based upon the disclosure provided herein, one of ordinary skill in the art will recognize a variety of stripping processes that may be used in relation to different embodiments of the present inventions. The resulting inorganic layer including the wells having a partially exposed electrical connectivity layer exposed in the wells disposed over the transparent substrate forms a fluidic assembly substrate.

In conclusion, the invention provides novel systems, devices, methods and arrangements for forming structures on a substrate. While detailed descriptions of one or more embodiments of the invention have been given above, various alternatives, modifications, and equivalents will be apparent to those skilled in the art without varying from the spirit of the invention. In addition, substrates with these patterned features can be used in various device assembly methods that include fluidic assembly, pick-n-place assembly, or other methods. Therefore, the above description should not be taken as limiting the scope of the invention, which is defined by the appended claims.

What is claimed is:

1. A method for manufacturing a fluidic assembly substrate, the method comprising:
   providing a transparent substrate;
   forming an electrical connectivity layer on top of the transparent substrate;
   depositing an inorganic material over the transparent substrate and the electrical connectivity layer to form an inorganic material layer that comprises a first portion and a second portion, wherein the first portion includes a combination of the inorganic material and the transparent substrate and excludes the electrical connectivity layer, the first layer having a first optical absorption, and wherein the second portion includes a combination of the inorganic material and the transparent substrate and excludes the electrical connectivity layer, the second portion having a second optical absorption, wherein the first portion is substantially transparent and the second potion is opaque;
   forming a patterned hard mask atop the inorganic material layer with openings exposing portions of the inorganic material layer corresponding to structure locations; and performing a dry etch guided by the patterned hard mask to open trapezoidal-shaped structures in the inorganic material layer extending to a top surface of the transparent substrate.

2. The method of claim 1, wherein the transparent substrate is made of a first glass, and wherein the inorganic material is a second glass exhibiting a susceptibility to etching that is different than the first glass.

3. The method of claim 2, wherein depositing the inorganic material over the transparent substrate and the electrical connectivity layer includes performing plasma enhanced chemical vapor deposition of Tetra-ethyl-ortho silicate over the transparent substrate and the electrical connectivity layer.

4. The method of claim 1, wherein forming the patterned hard mask atop the inorganic material layer with openings exposing portions of the inorganic material layer corresponding to structure locations includes:
depositing nickel on top of the inorganic material layer;
performing photolithography to define the openings; and
performing a wet etch to expose portions of a top surface of the inorganic material layer corresponding to the openings.

5. The method of claim 1, wherein the dry etch is selected from a group consisting of: a reactive ion etch (RIE), and an inductive coupled plasma and reactive ion etching (ICP-RIE).

6. The method of claim 1, wherein a sidewall of each of the wells is substantially vertical relative to the top surface of the transparent substrate.

7. The method of claim 1, wherein the top surface of the transparent substrate exposed by each of the trapezoidal-shaped structures in the inorganic material layer is substantially planar.

8. The method of claim 1, wherein a portion of the electrical connectivity layer is exposed by the dry etch at the bottom of at least one of the structures in the inorganic material layer.

9. The method of claim 1, wherein the wells each have a depth of greater than three microns and a width of greater than forty microns.

10. The method of claim 1, wherein a combination of the transparent substrate and the inorganic material layer is mechanically stable at temperatures up to six hundred degrees Celsius.

11. The method of claim 1, wherein a susceptibility of the inorganic material to the dry etch is greater than a susceptibility of the transparent substrate to the dry etch causing a stop to the dry etch.

12. The method of claim 1 wherein the trapezoidal-shaped structures in the inorganic material layer are wells each having a depth substantially equal to a thickness of the inorganic material layer.

13. The method of claim 12, wherein for at least one of said wells a first portion of the electrical connectivity layer extends under the inorganic material and a second portion of the electrical connectivity layer is exposed at the bottom of the at least one of said wells, the first portion longer than the second portion.

14. The method of claim 12, a sidewall of each of the wells exhibits an angle of greater than ninety-one degrees and less than one-hundred, five degrees measured from the top surface of the transparent substrate.

15. The method of claim 12, wherein the wells are formed to accommodate top and bottom electrical contacts of a micro-device.

* * * * *